US011538682B2

(12) United States Patent
Chiu et al.

(10) Patent No.: US 11,538,682 B2
(45) Date of Patent: *Dec. 27, 2022

(54) METHOD FOR GROWING A TRANSITION METAL DICHALCOGENIDE LAYER, TRANSITION METAL DICHALCOGENIDE GROWTH DEVICE, AND METHOD FOR FORMING A SEMICONDUCTOR DEVICE

(71) Applicant: KING ABDULLAH UNIVERSITY OF SCIENCE AND TECHNOLOGY, Thuwal (SA)

(72) Inventors: Ming-Hui Chiu, Thuwal (SA); Hao-Ling Tang, Thuwal (SA); Lain-Jong Li, Thuwal (SA)

(73) Assignee: KING ABDULLAH UNIVERSITY OF SCIENCE AND TECHNOLOGY, Thuwal (SA)

( * ) Notice: Subject to any disclaimer, the term of this patent is extended or adjusted under 35 U.S.C. 154(b) by 52 days.

This patent is subject to a terminal disclaimer.

(21) Appl. No.: 16/761,054

(22) PCT Filed: Oct. 16, 2018

(86) PCT No.: PCT/IB2018/058007
§ 371 (c)(1),
(2) Date: May 1, 2020

(87) PCT Pub. No.: WO2019/092521
PCT Pub. Date: May 16, 2019

(65) Prior Publication Data
US 2021/0183650 A1 Jun. 17, 2021

Related U.S. Application Data
(60) Provisional application No. 62/628,115, filed on Feb. 8, 2018, provisional application No. 62/582,462, filed on Nov. 7, 2017.

(51) Int. Cl.
*H01L 21/02* (2006.01)
*C23C 16/04* (2006.01)
(Continued)

(52) U.S. Cl.
CPC ........ *H01L 21/02568* (2013.01); *C23C 16/04* (2013.01); *C23C 16/305* (2013.01);
(Continued)

(58) Field of Classification Search
CPC ........... H01L 21/02568; H01L 21/0262; H01L 21/02365; H01L 21/02417; H01L 31/072;
(Continued)

(56) References Cited

U.S. PATENT DOCUMENTS 9,577,049 B1* 2/2017 Lin .................... H01L 29/41733
10,998,452 B2* 5/2021 Li ..................... H01L 21/02568
(Continued)

FOREIGN PATENT DOCUMENTS

CN 103928340 A 7/2014
CN 105742191 A 7/2016
(Continued)

OTHER PUBLICATIONS

Amani, M., et al., "Near-Unity Photoluminescence Quantum Yield in MoS2," Science, Nov. 27, 2015, vol. 350, Issue 6264, pp. 1065-1068, including Supplementary Materials.
(Continued)

*Primary Examiner* — Dale E Page
*Assistant Examiner* — Quovaunda Jefferson
(74) *Attorney, Agent, or Firm* — Patent Portfolio Builders PLLC

(57) ABSTRACT

A method for growing a transition metal dichalcogenide layer involves arranging a substrate having a first transition metal contained pad is arranged in a chemical vapor deposition chamber. A chalcogen contained precursor is arranged
(Continued)

upstream of the substrate in the chemical vapor deposition chamber. The chemical vapor deposition chamber is heated for a period of time during which a transition metal dichalcogenides layer, containing transition metal from the first transition metal contained pad and chalcogen from the chalcogen contained precursor, is formed in an area adjacent to the first transition metal contained pad.

20 Claims, 10 Drawing Sheets

(51) Int. Cl.
    *C23C 16/30*     (2006.01)
    *C23C 16/46*     (2006.01)
    *H01L 31/072*     (2012.01)
    *H01L 31/18*     (2006.01)
    *H01L 33/00*     (2010.01)

(52) U.S. Cl.
    CPC .......... *C23C 16/46* (2013.01); *H01L 21/0262* (2013.01); *H01L 31/072* (2013.01); *H01L 31/18* (2013.01); *H01L 33/002* (2013.01); *H01L 33/005* (2013.01)

(58) Field of Classification Search
    CPC ..... H01L 31/18; H01L 33/002; H01L 33/005; C23C 16/04; C23C 16/305; C23C 16/46; C23C 16/40; C23C 16/0629; C23C 8/06; C23C 8/08; C23C 14/04; C23C 14/0623
    See application file for complete search history.

(56) References Cited

U.S. PATENT DOCUMENTS

| | | |
|---|---|---|
| 2014/0251204 A1 | 9/2014 | Najmaei et al. |
| 2015/0064471 A1 | 3/2015 | Dresselhaus et al. |
| 2016/0093491 A1* | 3/2016 | Choi ................ H01L 21/02631 438/151 |
| 2016/0240376 A1 | 8/2016 | Yeh et al. |
| 2017/0011915 A1 | 1/2017 | Cannara et al. |
| 2021/0043452 A1* | 2/2021 | Kim .................. H01L 21/02417 |

FOREIGN PATENT DOCUMENTS

| | | |
|---|---|---|
| CN | 106917072 A | 7/2017 |
| KR | 20170120795 A | 11/2017 |
| WO | 2016133570 A1 | 8/2016 |
| WO | 2017100616 A1 | 6/2017 |
| WO | 2018092025 A1 | 5/2018 |

OTHER PUBLICATIONS

Bauther, B.W.H., et al., "Optoelectronic Devices Based on Electrically Tunable p-n Diodes in a Monolayer Dichalcogenide," Nature Nanotechnology, Apr. 2014, vol. 9, pp. 262-267.
Chen, M.-C., et al., "TMD FinFET with 4 nm Thin Body and Back Gate Control for Future Low Power Technology," 2015 IEEE International Electron Devices Meeting (IEDM), Washington, DC, Dec. 2015, pp. 32.2.1-32.2.4.
Chiu, M.-H., et al., "Spectroscopic Signatures for Interlayer Coupling in MoS2—WSe2 van der Waals Stacking," ACSNANO, Sep. 7, 2014, vol. 8, No. 9, pp. 9649-9656.
Cho, A.-J., et al., "A High-Performance Complementary Inverter Based on Transition Metal Dichalcogenide Field-Effect Transistors," Nanoscale Research Letters, Mar. 10, 2015, vol. 10, Article No. 115, 6 pages.
Duan, X., et al., "Lateral Epitaxial Growth of Two-Dimensional Layered Semiconductor Heterojunctions," Nature Nanotechnology, Dec. 2014, vol. 9, pp. 1024-1030.
Fang, H., et al., "High-Performance Single Layered WSe2 p-FETs with Chemically Doped Contacts," Nano Letters, Jun. 14, 2012, vol. 12, pp. 3788-3792.
Gao, Y., et al., "Large-Area Synthesis of High-Quality and Uniform Monolayer WS2 on Reusable Au Foils," Nature Communications, Oct. 9, 2015, 10 pages.
Gong, Y., et al., "Vertical and In-Plane Heterostructures from WS2/MoS2 Monolayers," Nature Materials, Dec. 2014, vol. 13, pp. 1135-1142.
Huang, C., et al., "Lateral Heterojunctions Within Monolayer MoSe2—WSe2 Semiconductors," Nature Materials, Dec. 2014, vol. 13, pp. 1096-1101.
Huang, J.-K., et al., "Large-Area Synthesis of Highly Crystalline WSe2 Monolayers and Device Applications," ACSNANO, Dec. 14, 2013, vol. 8, No. 1, pp. 923-930.
International Search Report in corresponding/related International Application No. PCT/IB2018/058007, dated Feb. 27, 2019.
Jeon, P.J., et al., "Low Power Consumption Complementary Inverters with n-MoS2 and p-WSe2 Dichalcogenide Nanosheets on Glass for Logic and Light-Emitting Diode Circuits," Applied Materials & Interfaces, Sep. 24, 2015, vol. 7, pp. 22333-22340.
Kang, K., et al., "High-Mobility Three-Atom-Thick Semiconducting Films with Wafer-Scale Homogeneity," Nature, vol. 520, Apr. 30, 2015, pp. 656-660.
Larentis, S., et al., "Field-Effect Transistors and Intrinsic Mobility in Ultra-Thin MoSe2 Layers," Applied Physics Letters, Nov. 26, 2012, vol. 1010, pp. 223104-1-223104-4.
Lee, Y.-H., et al., "Synthesis of Large-Area MoS2 Atomic Layers with Chemical Vapor Deposition," Advanced Materials, Mar. 30, 2012, vol. 24, pp. 2320-2325.
Li, M.-Y., et al., "Epitaxial Growth of a Monolayer WS32—MoS2 Lateral p-n Junction with an Atomically Sharp Interface," Science, Jul. 31, 2015, vol. 349, Issue 6247, pp. 524-528, including Editor's Summary.
Lin, Y.-C., et al., "Properties of Individual Dopant Atoms in Single-Layer MoS2: Atomic Structure, Migration, and Enhanced Reactivity," Advanced Materials, Feb. 22, 2014, vol. 26, pp. 2857-2861.
Lin, Y.-C., et al., "Water-Scale MoS2 Thin Layers Prepared by MoO3 Sulfurization," Nanoscale, Aug. 26, 2012, vol. 4, pp. 6637-6641.
Liu, H., et al., "Phosphorene: An Unexplored 2D Semiconductor with a High Hole Mobility," ACSNANO, Mar. 17, 2014, vol. 8, No. 4, pp. 4033-4041.
Pezeshki, A., et al., "Static and Dynamic Performance of Complementary Inverters Based on Nanosheet a-MoTe2 p-Channel and MoS2 n-Channel Transistors," ACSNANO, Dec. 3, 2015, vol. 10, pp. 1118-1125.
Pospischil, A., et al., "Solar-Energy Conversion and Light Emission in an Atomic Monolayer p-n Diode," Nature Nanotechnology, Apr. 2014, vol. 9, pp. 257-261.
Pu, J., et al., "Highly Flexible and High-Performance Complementary Inverters of Large-Area Transition Metal Dichalcogenide Monolayers," Advanced Materials, Mar. 23, 2016, vol. 28, pp. 4111-4119.
Radisavljevic, B., et al., "Single-Layer MoS2 Transistors," Nature Nanotechnology, Mar. 2011, vol. 6, pp. 147-150.
Ross, J.S., et al., "Electrically Tunable Excitonic Light-Emitting Diodes Based on Monolayer WSe2 p-n Junctions," Nature Nanotechnology, Apr. 2014, vol. 9, pp. 268-272.
Rothschild, A., et al., "Synthesis of Bulk WS2 Nanotube Phases," Materials Research Innovations, Oct. 1999, vol. 3, pp. 145-149.
Sachid, A.G., et al., "Monolithic 3D CMOS Using Layered Semiconductors," Advanced Materials, Feb. 2, 2016, vol. 28, pp. 2547-2554.
Sun, L., et al., "Concurrent Synthesis of High-Performance Monolayer Transition Metal Disulfides," Advanced Functional Materials, Mar. 9, 2017, 1605896, 8 pages.
Tosun, M., et al., "High-Gain Inverters Based on WSe2 Complementary Field-Effect Transistors," ACSNANO, Mar. 31, 2014, vol. 8, No. 5, pp. 4948-4953.
Van Der Zande, A.M., et al., "Grains and Grain Boundaries in Highly Crystalline Monolayer Molybdenum Disulphide," Nature Materials, Jun. 2013, vol. 12, pp. 554-561.

(56) References Cited

OTHER PUBLICATIONS

Wang, H., et al., "Integrated Circuits Based on Bilayer MoS2 Transistors," Nano Letters, Aug. 3, 2020, vol. 12, pp. 4674-4680.
Wang, S., et al., "Effect of Oxygen and Ozone on p-Type Doping of Ultra-Thin WSe2 and Mose2 Field Effect Transistors," Physical Chemistry Chemical Physics, Jan. 13, 2016, vol. 18, pp. 4304-4309.
Wang, X., et al., "Chemical Vapor Deposition Growth of Crystalline Monolayer MoSe2," ACSNANO, Mar. 29, 2014, vol. 8, No. 5, pp. 5125-5131.
Written Opinion of the International Searching Authority in corresponding/related International Application No. PCT/IB2018/058007, dated Feb. 27, 2019.
Xu, F., et al., "Patterned Growth of Tungsten Oxide and Tungsten Oxynitride Nanorods from Au-Coated W Foil," Nanoscale, Sep. 2012, vol. 4, pp. 7031-7037.
Zhang, Y.J., et al., "Formation of a Stable p-n Junction in a Liquid-Gated MoS2 Ambipolar Transistor," Nano Letters, Jun. 24, 2013, vol. 13, pp. 3023-3028.
Zhao, M., et al., "Large-Scale Chemical Assembly of Atomically Thin Transistors and Circuits," Nature Nanotechnology, Jul. 11, 2016, vol. 11, pp. 954-960.
First Office Action in corresponding/related Chinese Application No. 201880084982.3, dated Dec. 6, 2021.

\* cited by examiner

METHOD FOR GROWING A TRANSITION METAL DICHALCOGENIDE LAYER, TRANSITION METAL DICHALCOGENIDE GROWTH DEVICE, AND METHOD FOR FORMING A SEMICONDUCTOR DEVICE

CROSS-REFERENCE TO RELATED APPLICATIONS

This application is a U.S. National Stage of Application of International Application No. PCT/IB2018/058007, which claims priority to U.S. Provisional Patent Application No. 62/582,462, filed on Nov. 7, 2017, entitled "METHOD FOR CONTROLLING MULTIPLE TRANSITION METAL DICHALCOGENIDE GROWTH," and U.S. Provisional Patent Application No. 62/628,115, filed on Feb. 8, 2018, entitled "METHOD FOR GROWING A TRANSITION METAL DICHALCOGENIDE LAYER, TRANSITION METAL DICHALCOGENIDE GROWTH DEVICE, AND METHOD FOR FORMING A SEMICONDUCTOR DEVICE," the disclosures of which are incorporated herein by reference in their entirety.

BACKGROUND

Technical Field

Embodiments of the disclosed subject matter generally relate to a method for growing a transition metal dichalcogenide layer, a transition metal dichalcogenide growth device, and a method for forming a semiconductor device.

Discussion of the Background

Two-dimensional (2D) transition metal dichalcogenide (TMD) layered materials, such those with molybdenum disulphide ($MoS_2$) layers, have been recognized as high on-off ratio semiconductors, which are promising for high-quantum yield optoelectronics, next-generation transistors and integrated circuit applications. One problem with conventional transition metal dichalcogenide growth techniques is that there is little control over the growth location. For example, referring now to FIG. 1, in one conventional technique sulfur (S) 102 and transition metal 104 powders are arranged in a chemical vapor deposition chamber 106. Gas 108 is provided to the chemical vapor deposition chamber 106, which causes the sulfur 102 and transition metal 104 powders to flow to a substrate 110 on which the transition metal dichalcogenide layer 112 is grown while the chemical vapor deposition chamber 106 is heated. Specifically, in the illustrated example the transition metal is molybdenum (Mo), which is oxidized to form molybdenum trioxide ($MoO_3$), which then combines with the sulfur to form a molybdenum disulfide ($MoS_2$) layer 112.

Although this conventional technique results in a transition metal dichalcogenide layer 112 being formed on the substrate 110, there is little control over where on the substrate the layer 112 is grown, and it is only able to grow one transition metal dichalcogenide. This is particularly problematic for the formation of p-n junctions between two different transition metal dichalcogenide monolayers because such junctions cannot be grown on a common substrate using the sulfur 102 and transition metal 104 powders due to the inability to control the growth location on the substrate. Devices with p-n junctions between two different transition metal dichalcogenide monolayers are desirable because they enable device functionalities, including current rectifying, light emitting and photon harvesting.

Instead of using sulfur 102 and transition metal 104 powders to form p-n junctions between two different transition metal dichalcogenide monolayers, direct, epitaxial growth has been achieved. This process, however, is not location-selective because it allows the sulfur 102 and transition metal 104 to flow all over the substrate 110 and grow everywhere. Thus, it is not possible to control the growth location of transition metal dichalcogenide layer 112.

Another way of forming p-n junctions between two different transition metal dichalcogenide monolayers is ion implantation to transform one type of transition metal dichalcogenide to the other. Ion implantation, however, creates defects during the doping process, which degrade device performance.

Thus, it would be desirable to provide for growing transition metal dichalcogenide monolayers in a location-selective manner in a chemical vapor deposition chamber without the defects caused by conventional doping processes. It would also be desirable to provide for growing two different transition metal dichalcogenide monolayers in a location-selective manner in a chemical vapor deposition chamber without the defects caused by conventional doping processes.

SUMMARY

According to an embodiment, there is a method for growing a transition metal dichalcogenide layer. A substrate having a first transition metal contained pad is arranged in a chemical vapor deposition chamber. A chalcogen contained precursor is arranged upstream of the substrate in the chemical vapor deposition chamber. The chemical vapor deposition chamber is heated for a period of time during which a transition metal dichalcogenides layer, containing transition metal from the first transition metal contained pad and chalcogen from the chalcogen contained precursor, is formed in an area adjacent to the first transition metal contained pad.

According to another embodiment, there is a transition metal dichalcogenide growth device, which includes a substrate, a transition metal contained pad arranged on the substrate, and an area of the substrate adjacent to the transition metal contained pad that includes a transition metal dichalcogenide layer containing a transition metal from the transition metal contained pad.

According to a further embodiment, there is a method for forming a semiconductor device. A transition metal dichalcogenide layer is grown by arranging a substrate having first transition metal contained pad in a chemical vapor deposition chamber; arranging a chalcogen contained precursor upstream of the substrate in the chemical vapor deposition chamber; and heating the chemical vapor deposition chamber for a period of time during which a transition metal dichalcogenides layer, containing transition metal from the first transition metal contained pad, is formed in an area adjacent to the first transition metal contained pad. A remaining portion of the semiconductor device is formed outside of the chemical vapor deposition chamber using a complementary metal oxide semiconductor process.

BRIEF DESCRIPTION OF THE DRAWINGS

The accompanying drawings, which are incorporated in and constitute a part of the specification, illustrate one or more embodiments and, together with the description, explain these embodiments. In the drawings.

DETAILED DESCRIPTION

The following description of the exemplary embodiments refers to the accompanying drawings. The same reference numbers in different drawings identify the same or similar elements. The following detailed description does not limit the invention. Instead, the scope of the invention is defined by the appended claims. The following embodiments are discussed, for simplicity, with regard to the terminology and structure of transition metal dichalcogenide layer growth techniques Reference throughout the specification to "one embodiment" or "an embodiment" means that a particular feature, structure or characteristic described in connection with an embodiment is included in at least one embodiment of the subject matter disclosed. Thus, the appearance of the phrases "in one embodiment" or "in an embodiment" in various places throughout the specification is not necessarily referring to the same embodiment. Further, the particular features, structures or characteristics may be combined in any suitable manner in one or more embodiments.

Figure 1:
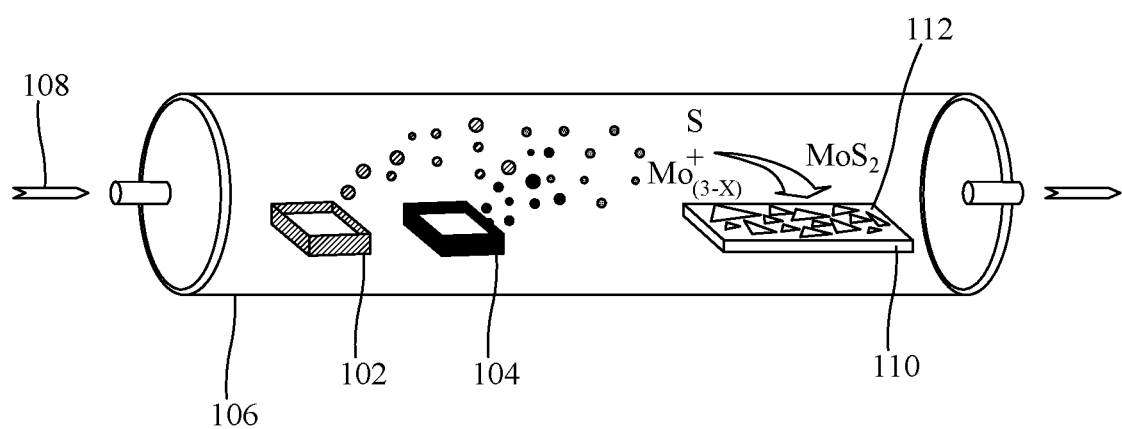
FIG. 1 is a schematic diagram of conventional method for growing a transition metal dichalcogenide layer.
Figure 2:
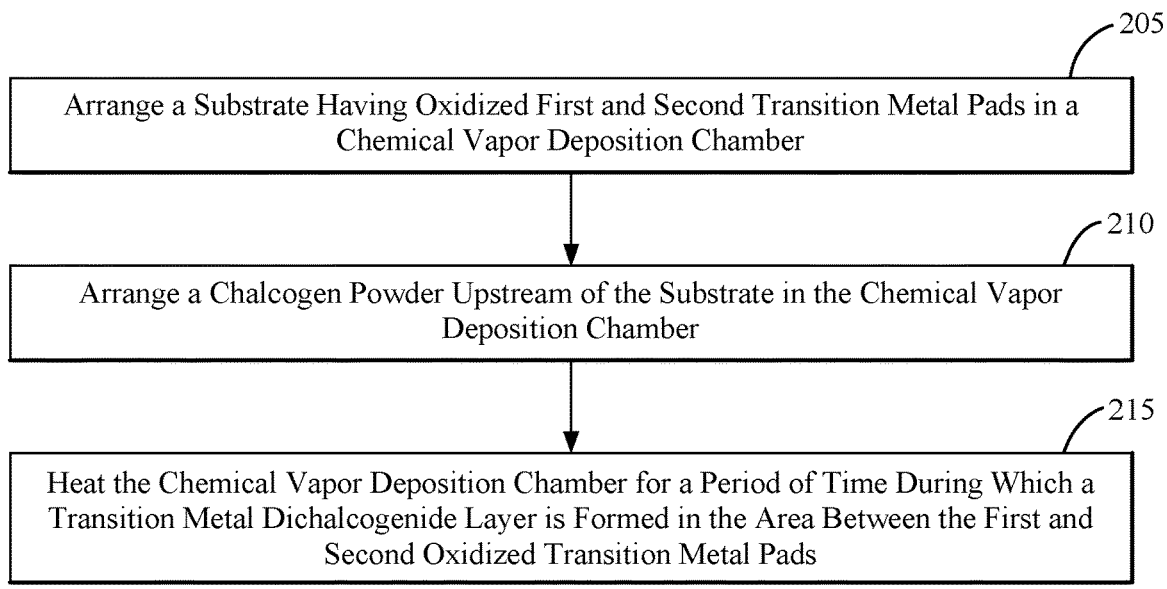
FIG. 2 is a flowchart of a method of growing a transition metal dichalcogenide layer according to an embodiment.

A method for growing a transition metal dichalcogenide layer will now be described in connection with FIGS. 2 and 3A. Initially, a substrate 305 having first 310A and second 310B transition metal contained pads is arranged in a chemical vapor deposition chamber 315 (step 205). In the illustrated embodiment, the transition metal contained pads are oxidized transition metal pads. Thus, the transition metal contained pads 310A and 310B include a transition metal, and can, but need not, include other material. Accordingly, reference herein to a transition metal contained pad includes an oxidized transition metal pad. Next, a chalcogen contained precursor 320 is arranged upstream of the substrate 305 in the chemical vapor deposition chamber 315 (step 210). In the illustrated embodiment, the chalcogen contained precursor 320 is chalcogen powder arranged in a quartz boat. Thus, the chalcogen contained precursor 320 include a chalcogen, and can, but need not, include other material. The chemical vapor deposition chamber 315 is then heated for a period of time during which a transition metal dichalcogenide layer is formed in the area 325 between the first 310A and second 310B transition metal contained pads (step 215). The heating can involve heating the chalcogen contained precursor 320 to, for example, 250° C. and the substrate 305 to, for example, 900° C. The heating of the chalcogen contained precursor 320 can be achieved using a second heater. It should be noted that the first and second transition metal contained pads 310A and 310B are no longer conductive after growing the transition metal dichalcogenide layer because all transition metal contained pads are all transferred into thick transition metal dichalcogenide pads.

Thus, it should be appreciated that the pre-patterned transition metal contained pads 310A and 310B provide transition metal sources in the local region and the edge of the transition metal contained pads 310A and 310B act as a seed for the transition metal dichalcogenide layer, and thus allows location selective growth of the transition metal dichalcogenide layer. As will also be appreciated, the transition metal of the transition metal contained pads 310A and 310B is the same transition metal as that of the transition metal dichalcogenide layer grown in the area 325 between the transition metal pads 310A and 310B.

In an embodiment, the transition metal can be molybdenum (Mo) and/or tungsten (W) and the chalcogen can be selenium (Se) and/or sulfide (S). However, other transition metals and chalcogens can be employed.

Figure 3A:
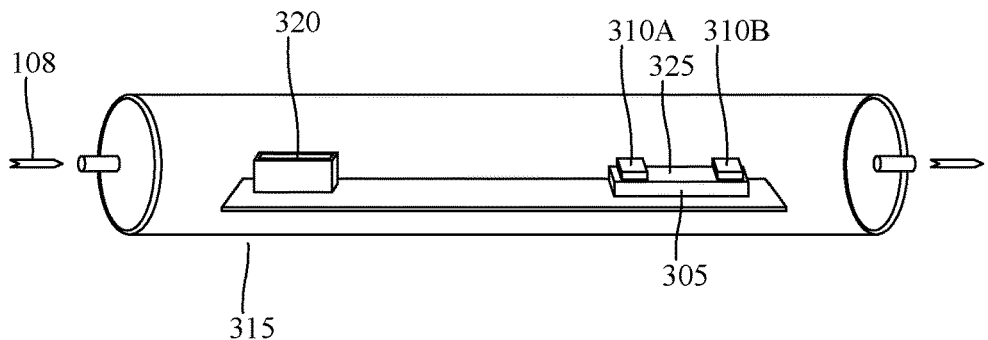
FIG. 3A is a schematic diagram of a system for growing a transition metal dichalcogenide layer according to an embodiment.
Figure 3B:
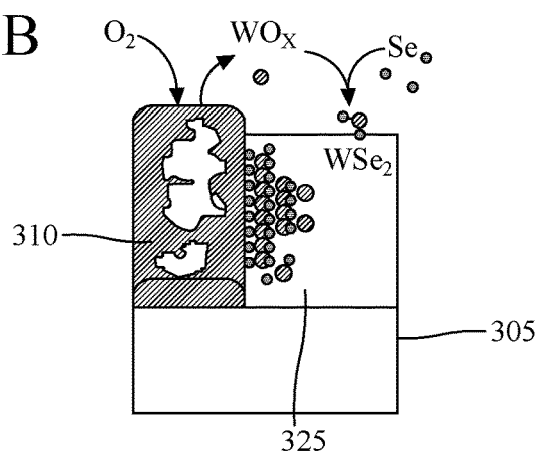
FIG. 3B is a schematic diagram of a transition metal dichalcogenide growth device according to an embodiment.

Although FIG. 3A illustrates a substrate 305 with two transition metal contained pads 310A and 310B, a substrate 305 with a single transition metal contained pad 310 can be employed, an example of which is illustrated by the schematic diagram of a transition metal dichalcogenide growth device in FIG. 3B. As illustrated, the area 325 adjacent to the transition metal contained pad 310 is provided for growing the transition metal dichalcogenide layer. In the illustrated embodiment, the transition metal is tungsten (W), which in the oxidized form is tungsten oxide ($WO_x$). The tungsten oxide reacts with the chalcogen, which in this embodiment is selenium to form a tungsten selenide ($WSe_2$) layer in the area 325 of the substrate 305.

Figure 4A:
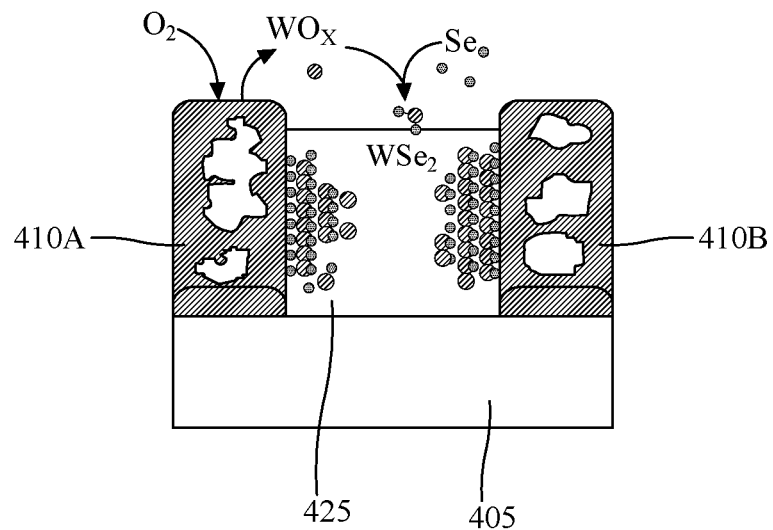
FIGS. 4A and 4B are schematic diagrams of a method of growing a transition metal dichalcogenide layer according to an embodiment.
Figure 4B:
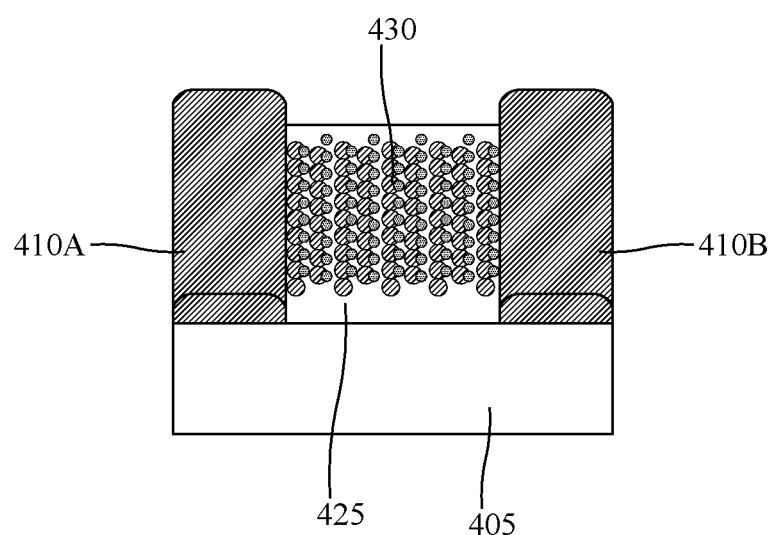

An example of the reaction for forming a transition metal dichalcogenides layer is illustrated in FIGS. 4A and 4B. As illustrated in FIG. 4A, the transition metal of the first 410A and second 410B transition metal contained pads is tungsten. The oxygen ($O_2$) used to oxidize the first transition metal contained pad 410A forms tungsten oxide ($WO_x$), which reacts with selenium to form tungsten diselenide ($WSe_2$) in the area 425 between the first 410A and second 410B transition metal contained pads on the substrate 405. The local concentration of vapors from the tungsten oxide of the first 410A and second 410B transition metal contained pads dominates the growth location, and thus the growth of a triangular tungsten diselenide monolayer is initiated from the edge of the first 410A and second 410B transition metal contained pads and is contained between the first 410A and second 410B transition metal contained pads. Thus, the use of the transition metal contained pads 410A and 410B allow for location selective growth of the transition metal dichalcogenide monolayer 430.

As illustrated in FIG. 4B, after a period of time while being heated, the monolayer crystals growing from the first 410A and second 410B transition metal contained pads merge as a film of a transition metal dichalcogenide monolayer 430 between the first 410A and second 410B transition metal contained pads.

Figure 5:
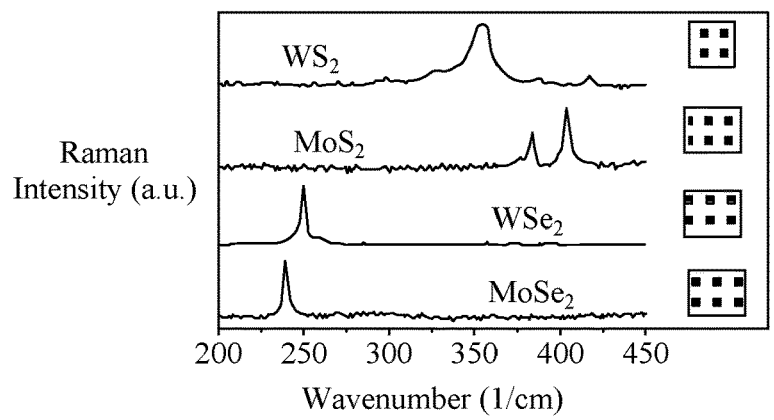
FIG. 5 is a Raman spectra graph of a transition metal dichalcogenide layer grown according to an embodiment.

FIG. 5 is a graph of the Raman spectra obtained from four different transition metal dichalcogenide monolayers formed using the disclosed method with molybdenum and tungsten as the transition metals and selenium and sulfur as the chalcogen. As illustrated in FIG. 5, the Raman spectrum shows characteristic peaks for $MoS_2$ at 384 $cm^{-1}$ (E') and 404 $cm^{-1}$ ($A'_1$), for $WS_2$ at 354 $cm^{-1}$ ($E^1_{2g}$) and 417 $cm^{-1}$ ($A_{1g}$), for $MoSe_2$ at 240 $cm^{-1}$ (degenerated $E_{2g}$ and $A_{1g}$) and for $WSe_2$ at 250 $cm^{-1}$ (degenerated E' and $A'_1$), which confirms they are each monolayers.

Figure 6:
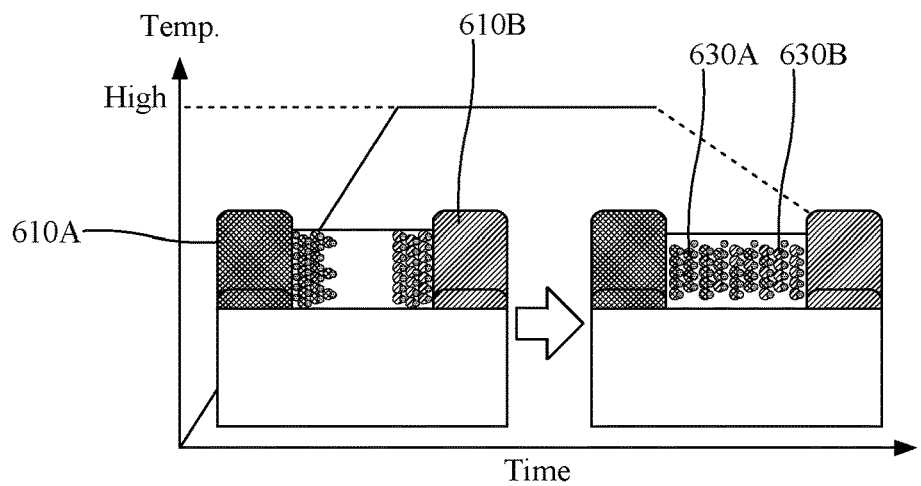
FIG. 6 is a schematic diagram of a method of growing a transition metal dichalcogenide layer having a lateral heterojunction according to an embodiment.
Figure 7:
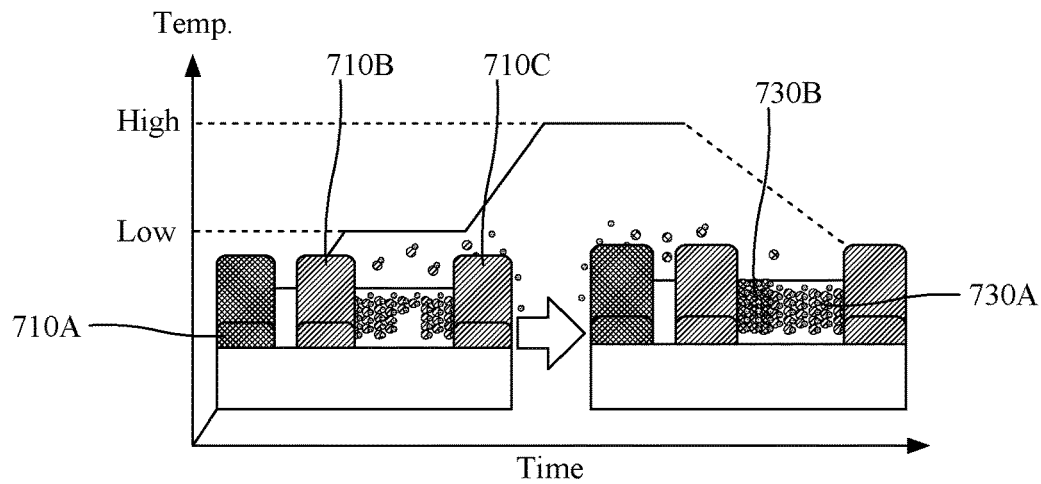
FIG. 7 is a schematic diagram of a method of growing a transition metal dichalcogenide layer having a vertical heterojunction according to an embodiment.

In addition to forming a transition metal dichalcogenide layer having a single transition metal, the disclosed method can be used to form lateral and vertical heterojunctions of transition metal dichalcogenides, which are respectively illustrated in FIGS. 6 and 7.

The lateral heterojunction of transition metal dichalcogenides illustrated in FIG. 6 is particularly useful as part of, for example, a light emitting diode (LED). As illustrated in FIG. 6, the first transition metal contained pad 610A comprises a first transition metal and the second transition metal contained pad 610B comprises a second transition metal. Accordingly, a lateral heterojunction transition metal dichalcogenide monolayer is grown by raising a temperature of the chemical vapor deposition chamber while a chalcogen contained precursor is arranged upstream, which causes a first portion 630A of the heterojunction to be grown with a first transition metal dichalcogenide and a second portion 630B of the heterojunction to be grown with a second transition metal dichalcogenide.

The vertical heterojunction of transition metal dichalcogenides illustrated in FIG. 7 is particularly useful as part of, for example, a solar cell. As illustrated in FIG. 7, the transition metal dichalcogenide growth device includes three transition metal contained pads, a first transition metal contained pad 710A comprising a first transition metal, and second 710B and third 710C transition metal contained pads comprising a second transition metal. Accordingly, a vertical heterojunction of two transition metal dichalcogenide monolayers is grown by raising a temperature of the chemical vapor deposition chamber to a first temperature while a chalcogen contained precursor is arranged upstream, which results in growth of the first transition metal dichalcogenide 730A monolayer and then raising the temperature to grow the second transition metal dichalcogenide monolayer 730B on top of the first transition metal dichalcogenide monolayer 730A.

Figure 8A:
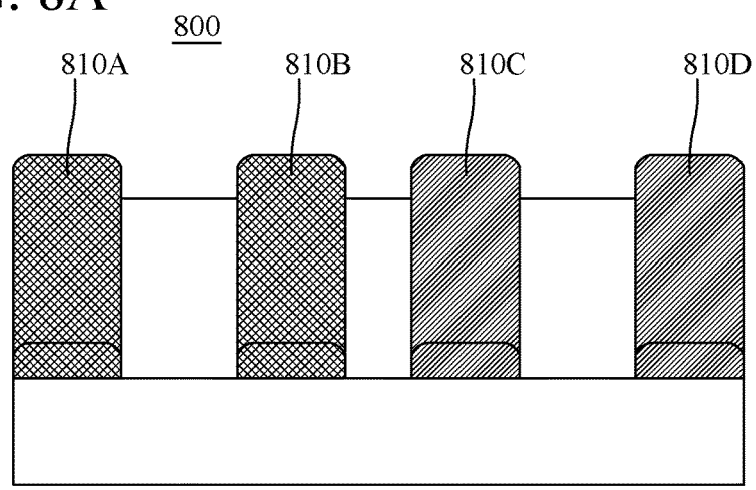
FIGS. 8A-8C are schematic diagrams of a method of growing two separate transition metal dichalcogenide layers according to an embodiment.
Figure 8B:
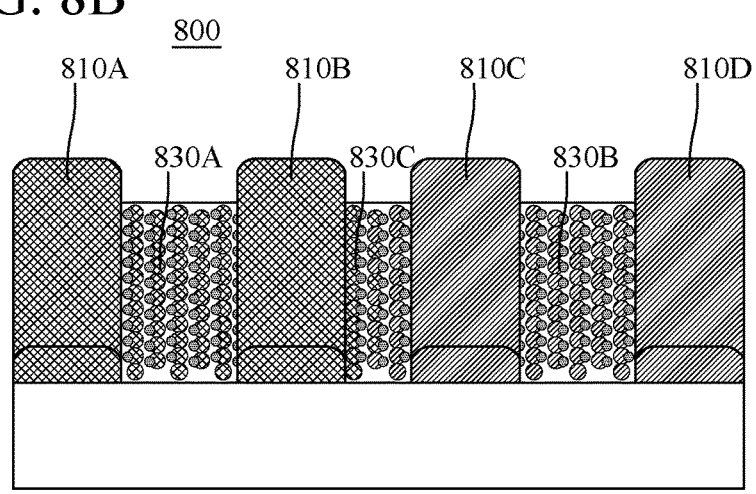
Figure 8C:
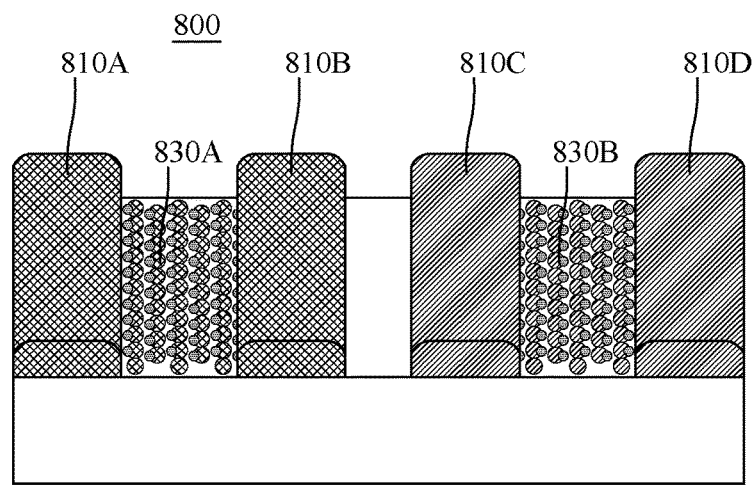

The disclosed methods can also be employed to form two separate transition metal dichalcogenide layers, one being a p-type monolayer and the other being an n-type monolayer, which is particular useful to form, for example, an inverter. An example of this is illustrated in FIGS. 8A-8C. In this embodiment, the transition metal dichalcogenide growth device 800 includes four transition metal contained pads, transition metal contained pads 810A and 810B are comprised of a first transition metal and transition metal contained pads 810C and 810D are comprised of a second transition metal. Accordingly, when transition metal growth dichalcogenide device 800 is placed in a vapor deposition chamber with a chalcogen contained precursor upstream and subjected to heat, a first transition metal dichalcogenide monolayer 830A is grown between the first 810A and second 810B transition metal contained pads and a second transition metal dichalcogenide monolayer 830B is grown between the third 810C and fourth 810D transition metal contained pads. As illustrated in FIG. 8B, another monolayer 830C having both transition metals is formed between the second 810B and third 810C transition metal contained pads. Accordingly, the first 830A and second 830B transition metal dichalcogenide monolayers are isolated by removing the monolayer 830C between the second 810A and third 810C transition metal contained pads to result in the device illustrated in FIG. 8C.

Figure 9:
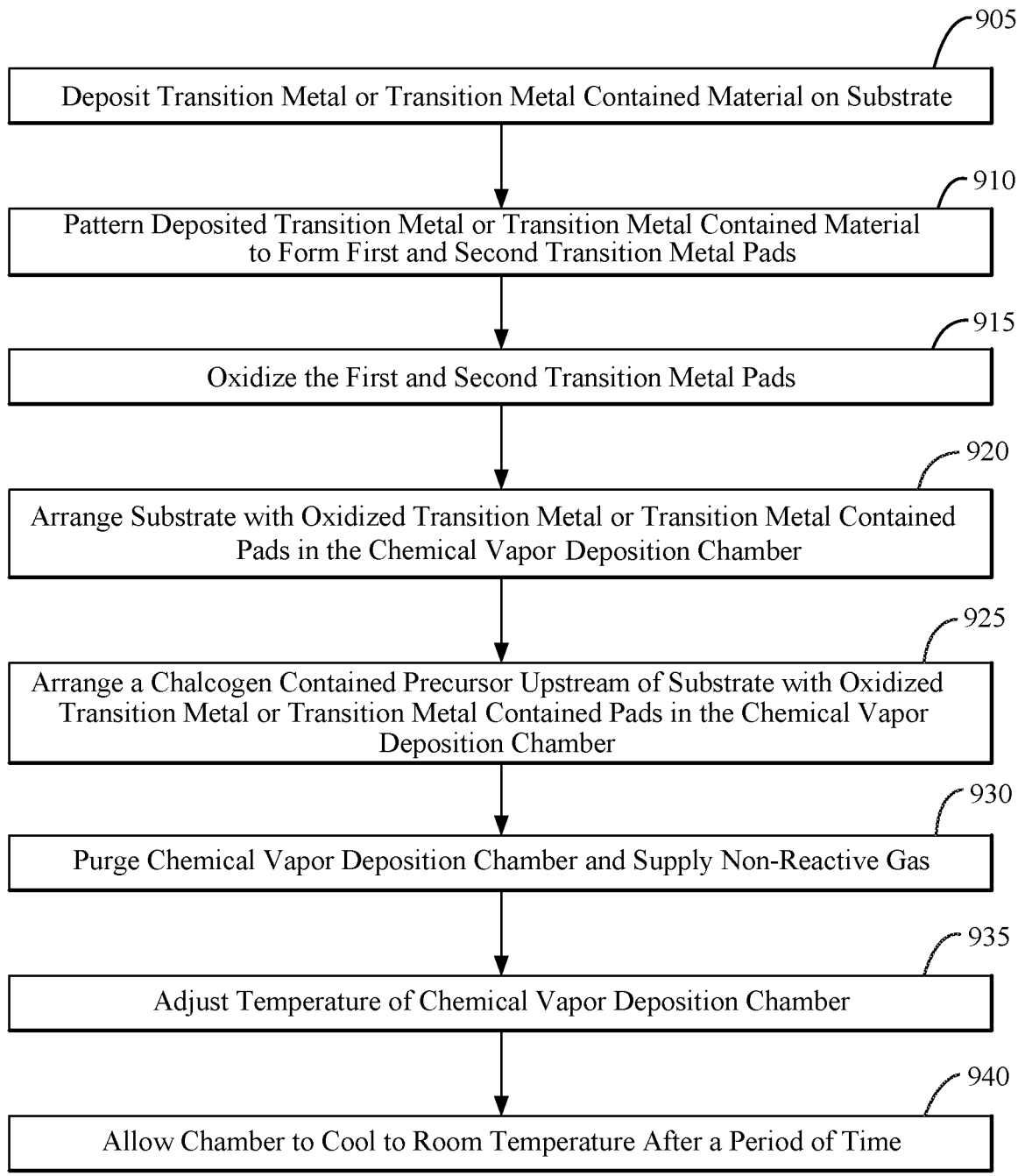
FIG. 9 is a flowchart of a method of growing a transition metal dichalcogenide layer according to an embodiment.

Additional details of a method of growing a transition metal dichalcogenide layer according to an embodiment will now be described in connection with FIGS. 3 and 9. Initially, a transition metal or transition metal contained material is deposited on a substrate 305 (step 905). In an embodiment, 50 nm of the transition metal is deposited on, for example, a sapphire substrate. It should be recognized, however, that other thickness of transition metals can be employed for forming a transition metal pad and other types of substrates (e.g., silicon dioxide, silicon nitride, and hafnium oxide) can be employed. Thus, the disclosed growth techniques are substrate insensitive. The pre-deposited pads are not limited in transition metals. All transition metal contained materials are applicable, such as transition metal oxide, transition metal chloride, etc.

The deposited transition metal or transition metal contained material is then patterned to form first 310A and second 310B transition metal pads or transition metal contained pads (step 910). The patterning can be achieved using, for example, photolithography. The first 310A and second 310B transition metal pads are oxidized (step 915). The oxidation can occur outside of the vapor deposition chamber 315 or can occur within the vapor deposition chamber by feeding oxygen into the chamber 315 while raising the temperature to one that causes the oxidation. If the oxidation of the first 310A and second 310B transition metal pads is performed within the chemical vapor deposition chamber 315, then step 915 can be omitted. If the first 310A and second 310B pads are transition metal contained pads, such as transition metal oxide pads, transition metal chloride pads, etc., then step 915 can be omitted.

The substrate 305 with the first 310A and second 310B oxidized transition metal or transition metal contained pads is then arranged in the chemical vapor deposition chamber 315 (step 920). A chalcogen contained precursor 320 is arranged upstream of the substrate 305 with first 310A and second 310B oxidized transition metal or transition metal contained pads in the chemical vapor deposition chamber 315 (step 925). Alternatively, the chalcogen contained precursor 320 can be arranged in the chemical vapor deposition chamber 315 and then the substrate 305 with the first 310A and second 310B oxidized transition metal or transition metal contained pads can arranged in the chemical vapor deposition chamber 315 downstream of the chalcogen contained precursor 320.

The chemical vapor deposition chamber 315 is then purged and supplied with a non-reactive gas (step 930). This can be achieved, for example, by reducing the pressure of the chemical vapor deposition chamber 315 to 0.1 mtorr. The purging can be performed, for example, for five minutes. The pressure in the chemical vapor deposition chamber is then increased to 8 torr and the supplied gas can be, for example, a constant flow of 65 sccm argon and 5 sccm hydrogen.

The temperature is adjusted to the temperature necessary for growing the transition metal dichalcogenide layer (step 935). Assuming the first 310A and second 310B oxidized transition metal or transition metal contained pads comprise the same transition metal, this adjustment is to a first predetermined temperature. The temperature adjustment can involve, for example, a ramping rate of 25° C./min and the growth time can be, for example, between 15 minutes and 1 hour.

If the first and second oxidized transition metal or transition metal contained pads are comprised different transition metals, such as the growth device illustrated in FIG. 6, this heating can involve modulating the temperatures to concurrently grow the heterojunction in a one-step chemical vapor deposition process. In an embodiment in which the two different transition metals are molybdenum and tungsten, this can involve modulating between 800 and 900° C. Assuming, for example, that the chalcogen is selenium, a molybdenum diselenide ($MoSe_2$) monolayer is grown from the edge of the first transition metal contained pad 610A and a tungsten diselenide ($WSe_2$) monolayer is grown from the edge of the second transition metal contained pad 610B. The growth of the molybdenum diselenide and tungsten diselenide monolayers forms an alloy region of $W_xMo_{1-x}Se_2$ between the two monolayers. In an embodiment, the alloy region occupies, for example 40 μm of the 100 μm channel between the first 610A and second 610B transition metal contained pads.

If a vertical heterojunction between two transition metal dichalcogenide monolayers is being formed using, for example, the growth device illustrated in FIG. 7, this heating can involve heating to a first temperature to grow the first monolayer and then heating at a second, higher temperature to grow the second monolayer. In an embodiment in which the two transition metals are molybdenum and tungsten, the first temperature can be between approximately 700-750° C., at which tungsten oxide does not evaporate, to form the molybdenum dichalcogenide monolayer and the second temperature can be between approximately 800-900° C. to form the tungsten dichalcogenide monolayer.

Once the monolayer(s) is/are formed, the chamber is allowed to cool to room temperature during which the growth of the layer(s) is completed (step 940).

Figure 10:
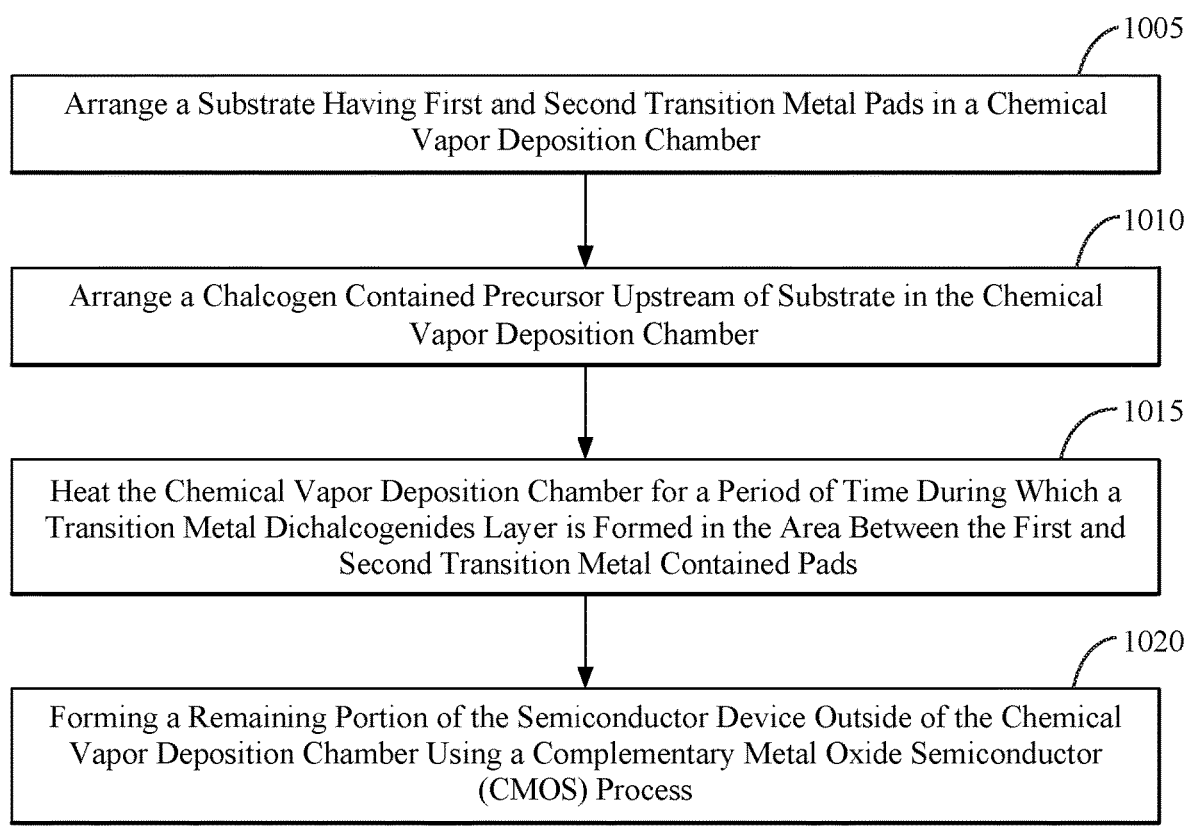
FIG. 10 is a flowchart of a method of forming a semiconductor device according to an embodiment.

Transition metal dichalcogenide monolayers are particularly useful in semiconductor devices. A method for forming a semiconductor device having a transition metal dichalcogenide monolayer will now be described in connection with FIGS. 3 and 10. Initially, a substrate having first 310A and second 310B transition metal contained pads is arranged in a chemical vapor deposition chamber 315 (step 1005). Next, a chalcogen contained precursor 320 is arranged upstream of the substrate 305 in the chemical vapor deposition chamber 315 (step 1010). The chemical vapor deposition chamber 315 is then heated for a period of time during which a transition metal dichalcogenide layer is formed in the area 325 between the first 310A and second 310B transition metal contained pads (step 1015). The remaining portion of the semiconductor device is then formed outside of the chemical vapor deposition chamber using a complementary metal oxide semiconductor (CMOS) process (step 1020). Those skilled in the art will recognize that CMOS processes are well known, and accordingly a detail description of such processes is not detailed any further.

Figure 11:
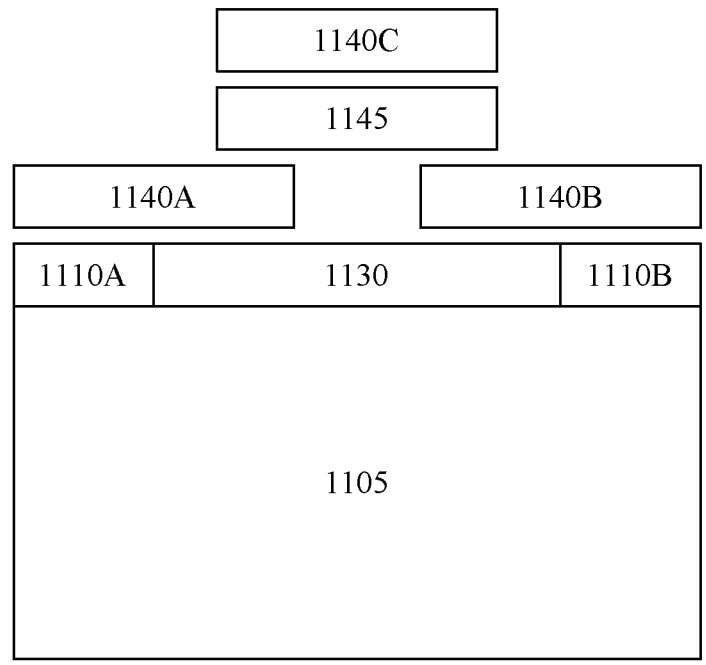
FIG. 11 is a schematic diagram of a semiconductor device formed according to an embodiment.

FIG. 11 is a schematic diagram of a semiconductor device formed according to the disclosed methods. The semiconductor device 1100 is a transistor having a single transition metal dichalcogenide layer comprising a single transition metal. The transistor 1100 includes a substrate 1105 on top of which is formed first 1110A and second 1110B transition metal contained pads. A transition metal dichalcogenide layer 1130 is formed between the first 1110A and second 1110B transition metal contained pads. A first metal electrode 1140A is formed on top of the first transition metal contained pad 1110A and the transition metal dichalcogenide layer 1130. A second metal electrode 1140B is formed on top of the second transition metal contained pad 1110B and the transition metal dichalcogenide layer 1130. A dielectric layer 1145 is formed on top of the first 1140A and second 1140B metal electrodes and a third metal electrode 1140C is formed on top of the dielectric layer 1145.

Figure 12:
FIG. 12 is a schematic diagram of a semiconductor device formed according to an embodiment.

FIG. 12 is a schematic diagram of another semiconductor device formed according to the disclosed methods. The semiconductor device 1200 is a light emitting diode having a lateral heterojunction transition metal dichalcogenide layer comprising two different transition metals. The light emitting diode 1200 includes a substrate 1205 on top of which is formed first 1210A and second 1210B transition metal contained pads. A transition metal dichalcogenide layer comprising a first transition metal dichalcogenide 1230A and a second transition metal dichalcogenide 1230B is formed between the first 1210A and second 1210B transition metal contained pads. A first metal electrode 1240A is formed on top of the first transition metal contained pad 1210A and the first transition metal dichalcogenide 1230A. A second metal electrode 1240B is formed on top of the second transition metal contained pad 1210B and the transition metal dichalcogenide 1230B. In an embodiment, the first transition metal dichalcogenide 1230A can be tungsten selenide ($WSe_2$), which exhibits characteristics of p-type doping, and the second transition metal dichalcogenide 1230B can be molybdenum selenide ($MoSe_2$), which exhibits characteristics of n-type doping.

Figure 13:
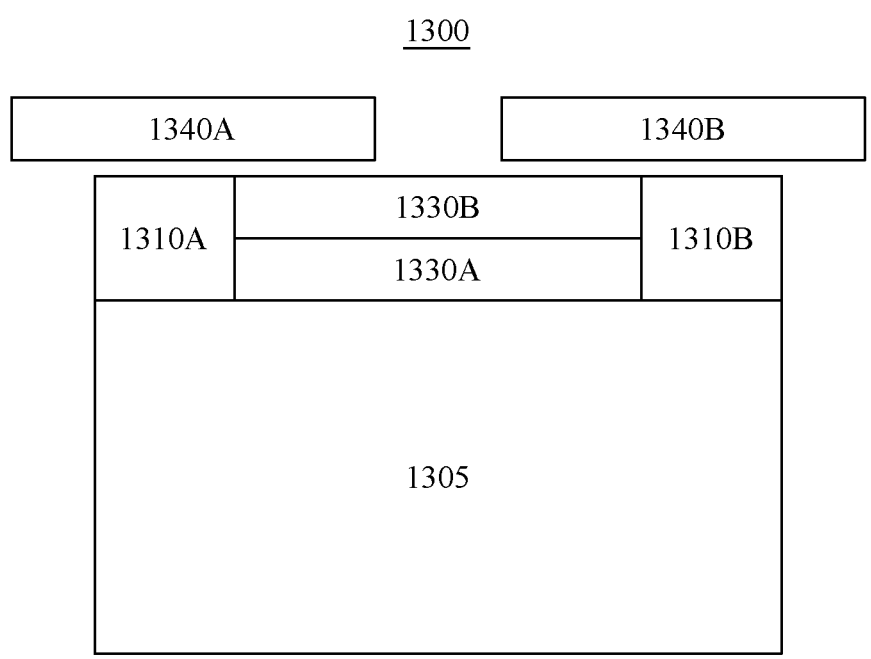
FIG. 13 is a schematic diagram of a semiconductor device formed according to an embodiment.

FIG. 13 is a schematic diagram of another semiconductor device formed according to the disclosed methods. The semiconductor device 1300 is a solar cell having vertical heterojunction transition metal dichalcogenide layers, each comprising a different transition metal. The solar cell 1300 includes a substrate 1305 on top of which is formed first 1310A and second 1310B transition metal contained pads. A first transition metal dichalcogenide layer 1330A comprising a first transition metal dichalcogenide is formed on top of the substrate 1305 between the first 1310A and second 1310B transition metal contained pads. A second transition metal dichalcogenide layer 1330B comprising a second transition metal dichalcogenide is formed on top of the first transition metal dichalcogenide layer 1330A between the first 1310A and second 1310B transition metal contained pads. A first metal electrode 1340A is formed on top of the first transition metal contained pad 1310A and the second transition metal dichalcogenide layer 1330B. A second metal electrode 1340B is formed on top of the second transition metal contained pad 1310B and the second transition metal dichalcogenide layer 1330B.

Figure 14A:
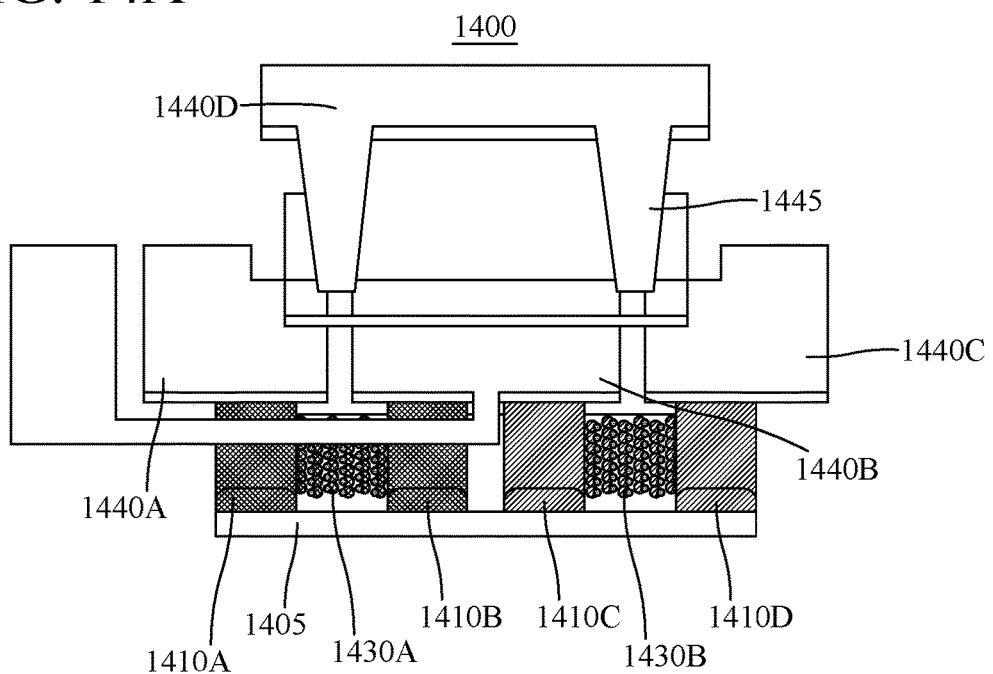
FIGS. 14A and 14B are schematic diagrams of a CMOS inverter formed according to an embodiment.
Figure 14B:
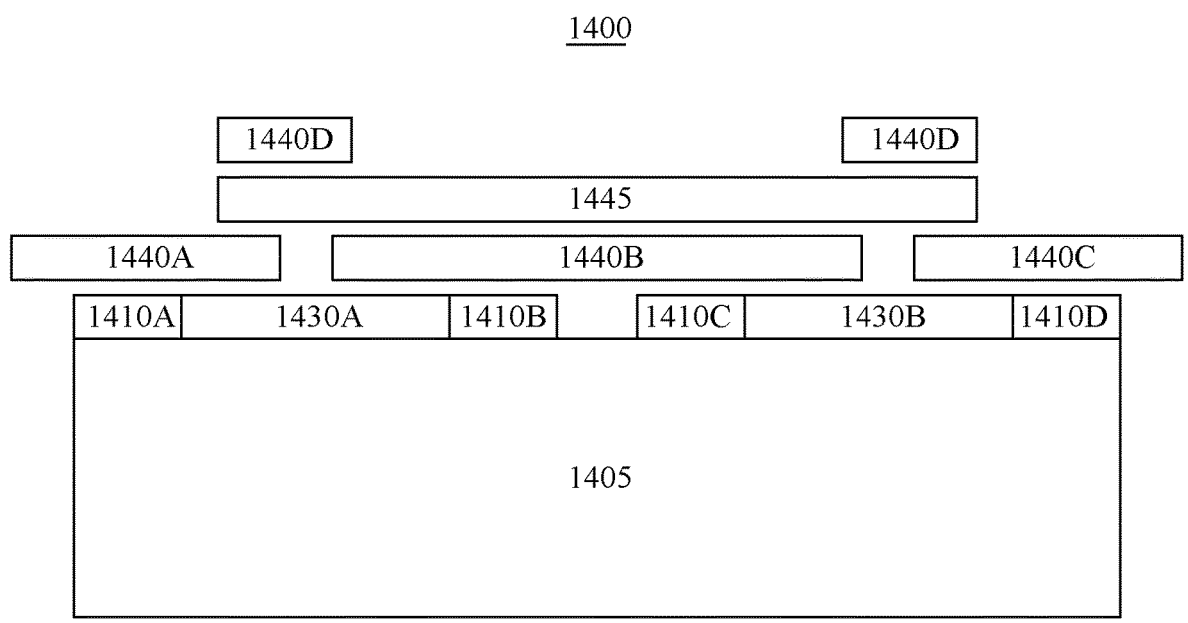

FIGS. 14A and 14B are schematic diagrams of another semiconductor device formed according to the disclosed methods. The semiconductor device 1400 is an inverter having two separate transition metal dichalcogenide layers, each comprising a different transition metal. The inverter 1400 includes a substrate 1405 on top of which is formed first 1410A, second 1410B, third 1410C, and fourth 1410D transition metal contained pads. A first transition metal dichalcogenide layer 1430A comprising a first transition metal dichalcogenide is formed on top of the substrate 1405 between the first 1410A and second 1410B transition metal contained pads. A second transition metal dichalcogenide layer 1430B comprising a second transition metal dichalcogenide is formed on top of the substrate 1405 between the third 1410C and fourth 1410D transition metal contained pads.

A first metal electrode 1440A is formed on top of the first transition metal contained pad 1410A and the first transition metal dichalcogenide layer 1430A. The first metal electrode 1440A is for connection to a supply voltage $V_{dd}$. A second metal electrode 1440B is formed on top of the second transition metal contained pad 1410B, the first transition metal dichalcogenide layer 1430A, the third transition metal contained pad 1410C, and the second transition metal dichalcogenide layer 1430B. The second metal electrode 1440B supplies the output $V_{out}$ of the inverter 1400. A third metal electrode 14400 is formed on top of the fourth transition metal contained pad 1410D and the second transition metal dichalcogenide layer 1430B. The third metal electrode 1440A is for connection to ground.

A dielectric layer 1445 (i.e., the gate dielectric) is arranged between the first 1440A, second 1440B, and third 1440C electrodes and the fifth electrode 1440D. In an embodiment, the dielectric layer 1445 is, for example, formed from Hafnium oxide ($HfO_2$). The fifth electrode 1440D is for connection to an input voltage $V_{in}$.

The inverter 1400 can be formed by taking the substrate 1405 having the transition metal contained pads 1410A-1410D and the first 1430A and second 1430B transition metal dichalcogenide layers and isolating the substrate by remote ion etching (RIE) process, operated under 200 W inductively coupled plasma (ICP) and 50 W radio frequency (RF) with 20 sccm $O_2$ and 5 sccm Ar. The electrode 1440A can comprise, for example, 20 nm Pd/30 nm Au and the electrode 1440C can comprise, for example, Au 20 nm Ni/30 nm. The electrodes 1440A and 1440B can be deposited by electron-beam evaporation and lift-off processes. The dielectric layer 1445 can be formed, for example, by atomic layer deposition process on both the first 1430A and second 1430B transition metal dichalcogenide layers.

As will be appreciated from the discussion above, the disclosed methods allow for location-selective growth of a transition metal dichalcogenide layer. Further, the disclosed methods allow for simultaneous growth of two dissimilar transition metal dichalcogenides in a one-step chemical vapor deposition process. Additionally, the disclosed methods provide a new way to control the delivery sequence of different precursors for forming a transition metal dichalcogenide layer.

The disclosed embodiments provide a method for growing a transition metal dichalcogenide layer, a transition metal dichalcogenide layer growth device, and method for forming a semiconductor device. It should be understood that this description is not intended to limit the invention. On the contrary, the exemplary embodiments are intended to cover alternatives, modifications and equivalents, which are included in the spirit and scope of the invention as defined by the appended claims. Further, in the detailed description of the exemplary embodiments, numerous specific details are set forth in order to provide a comprehensive understanding of the claimed invention. However, one skilled in the art would understand that various embodiments may be practiced without such specific details.

Although the features and elements of the present exemplary embodiments are described in the embodiments in particular combinations, each feature or element can be used alone without the other features and elements of the embodiments or in various combinations with or without other features and elements disclosed herein.

This written description uses examples of the subject matter disclosed to enable any person skilled in the art to practice the same, including making and using any devices or systems and performing any incorporated methods. The patentable scope of the subject matter is defined by the claims, and may include other examples that occur to those skilled in the art. Such other examples are intended to be within the scope of the claims.

What is claimed is:

1. A method for growing a transition metal dichalcogenide layer, the method comprising:
    arranging a substrate, which includes a first area having a first transition metal contained pad, in a chemical vapor deposition chamber, the substrate also having a second area free of a transition metal, adjacent to the first transition metal contained pad;
    arranging a chalcogen contained precursor upstream of the substrate in the chemical vapor deposition chamber; and
    heating the chemical vapor deposition chamber for a period of time during which a transition metal dichalcogenides layer, containing transition metal from the first transition metal contained pad and chalcogen from the chalcogen contained precursor, is formed in the second area, adjacent to the first transition metal contained pad.

2. The method of claim 1, wherein
    the substrate includes a second transition metal contained pad,
    the first transition metal contained pad comprises a first transition metal,
    the second transition metal contained pad comprises a second transition metal, and
    the transition metal dichalcogenides layer forms a heterojunction of a first transition metal dichalcogenide containing the first transition metal from the first transition metal contained pad and a second transition metal dichalcogenide containing the second transition metal from the second transition metal contained pad.

3. The method of claim 2, wherein the heating of the chemical vapor deposition chamber causes an alloy region to form between the first and second transition metal dichalcogenides.

4. The method of claim 2, further comprising:
    modulating the heating the chemical vapor deposition chamber between a first temperature to form the first transition metal dichalcogenide and a second temperature to form the second transition metal dichalcogenide.

5. The method of claim 4, further comprising:
    simultaneously growing the first transition metal dichalcogenide and the second transition metal dichalcogenide in a chemical vapor deposition process.

6. The method of claim 1, wherein
    the substrate includes a second transition metal contained pad and a third transition metal contained pad arranged upstream of the first and second transition metal contained pads,
    the first transition metal contained pad comprises a first transition metal,
    the second and third transition metal contained pads comprise a second transition metal, and the transition metal dichalcogenides layer includes a first layer of a first transition metal dichalcogenide formed from the second transition metal of the second and third transition metal contained pads and a second layer of second transition metal dichalcogenide formed from the first transition metal of the first transition metal contained pad, and the second layer of the second transition metal dichalcogenide is arranged on top of the first layer of the first transition metal dichalcogenide.

7. The method of claim 6, further comprising:
heating the chemical vapor deposition chamber to a first temperature to form the first transition metal dichalcogenide and then heating the chemical vapor deposition chamber to a second temperature, which is higher than the first temperature, to form the second transition metal dichalcogenide.

8. The method of claim 1, wherein
the substrate includes second, third and fourth transition metal contained pads,
the first and second transition metal contained pads comprise a first transition metal and are adjacent to each other,
the third and fourth transition metal contained pads comprise a second transition metal and are adjacent to each other, and
the second transition metal contained pad is adjacent to the third transition metal contained pad.

9. The method of claim 8, further comprising:
heating the chemical vapor deposition chamber at a first temperature to form the first transition metal dichalcogenide between the first and second transition metal contained pads, and
heating the chemical vapor deposition chamber at a second temperature, which is higher than the first temperature, to form the second transition metal dichalcogenide between the third and fourth transition metal contained pads.

10. The method of claim 9, wherein a transition metal dichalcogenide is formed between the second and third transition metal contained pads, the method further comprising:
removing the transition metal dichalcogenide formed between the second and third transition metal contained pads.

11. The method of claim 1, wherein the first transition metal contained pad is oxidized
prior to arranging the substrate in the chemical vapor deposition chamber, or
after the substrate with the first transition metal pad is arranged in the chemical vapor deposition chamber but prior to the period of time during which the chemical vapor deposition chamber is heated to form the transition metal dichalcogenides layer.

12. A transition metal dichalcogenide growth device, comprising:
a substrate having first and second areas, adjacent to each other;
a transition metal contained pad arranged on the first area of the substrate; and
a transition metal dichalcogenide layer containing a transition metal from the transition metal contained pad, the transition metal dichalcogenide layer being arranged on the second area of the substrate, adjacent to the transition metal contained pad.

13. The transition metal dichalcogenide growth device of claim 12, further comprising:
an additional transition metal contained pad,
wherein the transition metal contained pad and the additional transition metal contained pad comprise a first transition metal.

14. The transition metal dichalcogenide growth device of claim 12, further comprising:
an additional transition metal contained pad,
wherein the transition metal contained pad corn prises a first transition metal and the additional transition metal contained pad comprises a second transition metal, wherein the transition metal dichalcogenide layer is a heterojunction.

15. The transition metal dichalcogenide growth device of claim 12, further comprising:
an additional transition metal contained pad,
a third transition metal contained pad arranged on the substrate adjacent to the additional transition metal contained pad;
a fourth transition metal contained pad arranged on the substrate adjacent to the third transition metal contained pad,
wherein the transition metal contained pad and the additional transition metal contained pad comprise a first transition metal and the third and fourth transition metal contained pads comprise a second transition metal.

16. A method for forming a semiconductor device, the method comprising:
growing a transition metal dichalcogenide layer by
arranging a substrate, which includes a first area having a first transition metal contained pad in a chemical vapor deposition chamber, the substrate also having a second area free of a transition metal, adjacent to the first transition metal contained pad;
arranging a chalcogen contained precursor upstream of the substrate in the chemical vapor deposition chamber; and
heating the chemical vapor deposition chamber for a period of time during which a transition metal dichalcogenides layer, containing transition metal from the first transition metal contained pad, is formed in the second area, adjacent to the first transition metal contained pad; and
forming a remaining portion of the semiconductor device outside of the chemical vapor deposition chamber using a complementary metal oxide semiconductor process.

17. The method of claim 16, wherein
the first transition metal contained pad comprises a first transition metal,
the substrate includes a second transition metal contained pad comprising a second transition metal, and
the transition metal dichalcogenides layer forms a heterojunction of a first transition metal dichalcogenide and a second transition metal dichalcogenide.

18. The method of claim 17, further comprising:
heating the chemical vapor deposition chamber at a first temperature to form the first transition metal dichalcogenide and then heating the chemical vapor deposition chamber at a second temperature, which is higher than the first temperature, to form the second transition metal dichalcogenide,
wherein the transition metal dichalcogenide includes a first layer having the first transition metal dichalcogenide formed from the first transition metal of the first transition metal contained pad and a second layer, on top of the first layer, having the second transition metal dichalcogenide formed from the second transition metal of the second transition metal contained pad.

19. The method of claim 17, further comprising:
modulating the heating the chemical vapor deposition chamber between a first temperature to form the first transition metal dichalcogenide and a second temperature to form the second transition metal dichalcogenide.

20. The method of claim 19, further comprising:
simultaneously growing the first transition metal dichalcogenide and the second transition metal dichalcogenide in a chemical vapor deposition process.

* * * * *